United States Patent [19]

Okada et al.

[11] Patent Number: 5,180,001

[45] Date of Patent: Jan. 19, 1993

[54] HEAT TRANSFER MEMBER

[75] Inventors: Ryoji Okada, Shimoinayoshi; Motohiro Sato, Minori; Toshihiro Yamada, Tomobe; Heikichi Kuwabara, Minori, all of Japan

[73] Assignee: Hitachi, Ltd., Tokyo, Japan

[21] Appl. No.: 561,828

[22] Filed: Aug. 2, 1990

[30] Foreign Application Priority Data

Oct. 18, 1989 [JP]  Japan ................. 1-212660

[51] Int. Cl.$^5$ ............................................. F28F 13/00
[52] U.S. Cl. ..................... 165/80.4; 165/907; 165/133; 165/185; 361/385; 361/386
[58] Field of Search ............... 165/80.2–80.4, 165/185, 907, 133; 174/16.3; 357/81, 82; 361/385, 386

[56] References Cited

U.S. PATENT DOCUMENTS

| | | | |
|---|---|---|---|
| 3,560,815 | 2/1971 | Sigsbee | 357/14 |
| 3,706,127 | 12/1972 | Oktay et al. | 29/576 |
| 4,203,129 | 5/1980 | Oktay et al. | 357/82 |
| 4,277,816 | 7/1981 | Dunn et al. | 361/384 |
| 4,359,181 | 11/1982 | Chisholm | 228/183 |
| 4,777,560 | 10/1988 | Herrell et al. | 361/384 |
| 4,856,015 | 8/1989 | Matsui et al. | 372/50 |
| 4,896,719 | 1/1990 | O'Neill et al. | 165/170 |
| 4,981,172 | 1/1991 | Haerle | 165/133 |

FOREIGN PATENT DOCUMENTS

| | | | |
|---|---|---|---|
| 2333697 | 1/1975 | Fed. Rep. of Germany | 165/166 |
| 60-229353 | 11/1985 | Japan | |
| 1163126 | 6/1985 | U.S.S.R. | 165/185 |

OTHER PUBLICATIONS

"Snap-On Nucleate Boiling Promoter", from *IBM TDB* vol. 11, No. 3 Aug. 1968 by Chu et al.

*Primary Examiner*—Allen J. Flanigan
*Attorney, Agent, or Firm*—Antonelli, Terry Stout & Kraus

[57] ABSTRACT

A heat transfer member has a heat transfer unit mounted on a mounting sheet. The heat transfer unit comprises a plurality of layers of wire mesh laminated and bonded together and to the mounting sheet. The spaces between the wires of the mesh layers of the heat transfer unit permit liquid to pass through the heat transfer unit so as to conduct heat. A semiconductor element (IC chip) is mounted on the mounting sheet, and to a base. The resulting assembly is immersed in a liquid. Preferably, the planes of the mesh layers are generally perpendicular to the mounting sheet and the semiconductor element and the material of the mounting sheet chosen to have a thermal expansion coefficient between that of the semiconductor element and the heat transfer unit to reduce thermal stresses. The wires of the mesh layers are preferably of copper as this is inexpensive and provides satisfactory heat conduction.

17 Claims, 5 Drawing Sheets

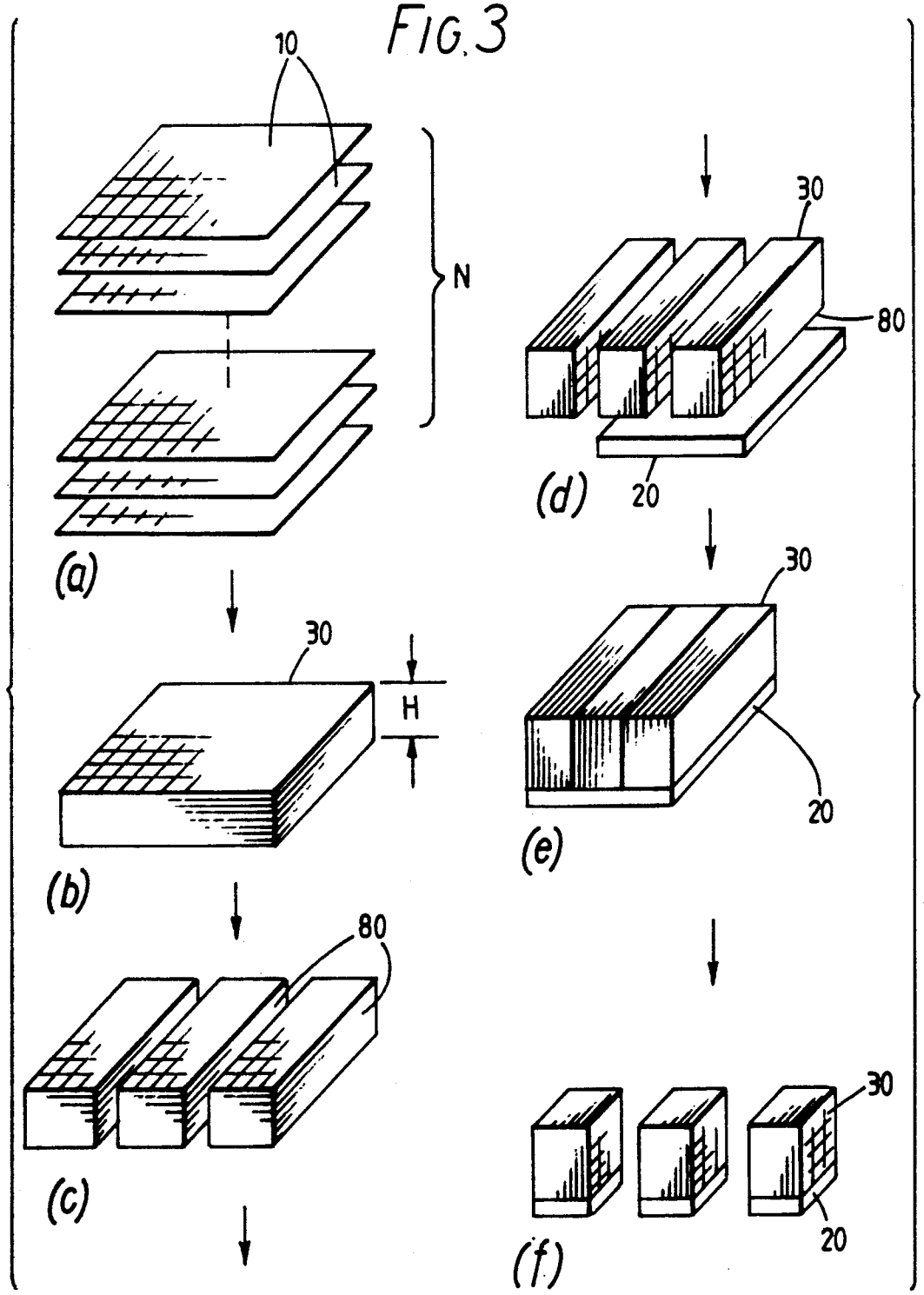

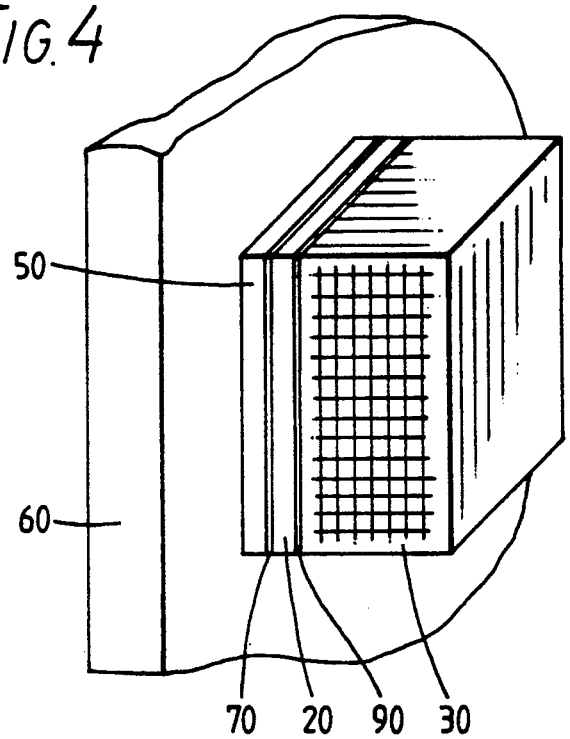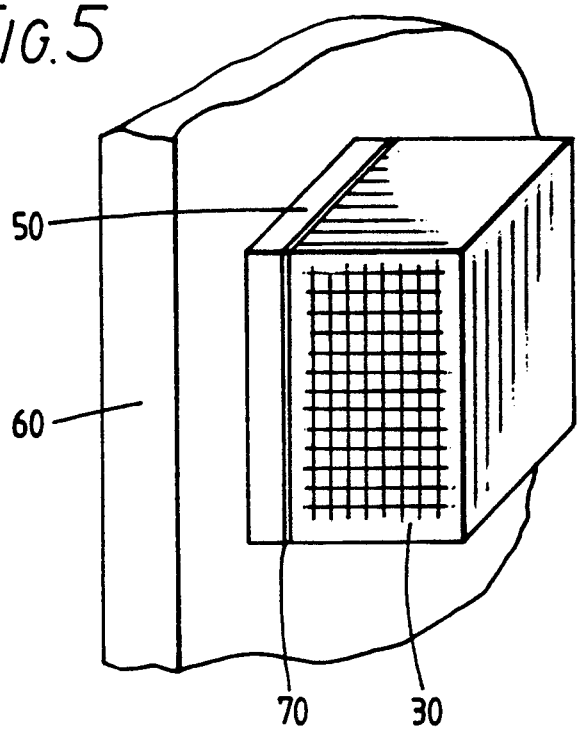

HEAT TRANSFER MEMBER

BACKGROUND OF THE INVENTION

1. Field of the Invention

The present invention relates to a heat transfer member, and to a heat transfer assembly including such a member and a semiconductor element. It is particularly, but not exclusively, concerned with a heat transfer member for use in immersion cooling of a semiconductor element.

2. Summary of the Prior Art

A recognised problem in the operation of a semiconductor element, particularly a LSI semiconductor chip, is to ensure that the semiconductor element does not overheat. One way of preventing overheating is to immerse the semiconductor element in a non-conducting, which liquid can then transport heat away from the semiconductor element. Such a technique is known as immersion cooling.

However, in such an arrangement, it is important to ensure satisfactory heat transfer from the semiconductor element to the liquid, and therefore a suitable heat transfer member should be connected to the semiconductor element.

U.S. Pat. No. 3,706,127 discloses an arrangement in which a large number of dendrites (needle-like metal parts) are formed on a surface of the semiconductor element by a suitable metallurgical process. The dendrites are heated when the semiconductor element operates, and therefore the dendrites may act to transfer heat away from the semiconductor element to the surrounding liquid. Since the dendrites have a large number of spaces therebetween, and since the dendrites are believed to have a surface structure with depressions which form bubble-forming nuclei, heat generated in the semiconductor element can rapidly be removed in the form of vapour bubbles of the liquid.

An alternative arrangement is disclosed in JP-A-60-229353. This arrangement will now be discussed in more detail with reference to FIG. 1 of the accompanying drawings. FIG. 1 illustrates a heat transfer assembly in which a heat transfer member 4 is mounted on a semiconductor element 5, which element 5 is itself mounted on a base 6 of e.g. Al₂O₃. The heat transfer member 4 comprises a plurality of solid layers 7, stacked to form a laminate unit, with that unit being mounted on the semiconductor element 5 via a mounting sheet 8. As can be seen from FIG. 1, the layers 7 have grooves 9 and 9a formed in opposed surfaces thereof, with the grooves 9 and 9a extending generally perpendicular to each other. When the assembly shown in FIG. 1 is immersed in liquid, the liquid enters the grooves 9, 9a, and efficient heat transfer can occur.

SUMMARY OF THE INVENTION

Neither the arrangement of U.S. Pat. No. 3,706,127 nor that of JP-A-60-229353 provides a wholly satisfactory solution to the problem of cooling of the semiconductor element. In the case of U.S. Pat. No. 3,706,127, there is the problem that it is difficult to control the formation of the dendrites, and therefore the heat transfer effect that they give will vary in an unpredictable way. Thus, it is difficult uniformly to obtain a dendrite structure with optimum cooling efficiency. Furthermore, the fine structure of the dendrites may cause an additional problem which is known as "burn-out". If the amount of heat passed from the dendrites to the liquid becomes very large, a film of vapour may be trapped adjacent to the semiconductor element, thereby reducing the amount of heat that is transferred. Then, the temperature of the semiconductor element will rise unacceptably. Furthermore, the dendrites are not always wholly stable, and if part of a dendrite peels off, floats in the liquid, and comes into contact with the wiring parts of the semiconductor element, this may cause a short-circuit, noise, or other malfunctions of the semiconductor element. Thus, the use of dendrites is unsatisfactory.

In the case of the arrangement disclosed in JP-A-60-0229353, the primary problem is one of cost. It is difficult and expensive to accurately form the grooves 9 and 9a in the layers 7 of the heat transfer member 4. Furthermore, the grooves 9 and 9a are normally formed by machining in which dust may be generated during this operation. Since the layers 7 are usually of metal, the metal dust may cause a short-circuit, noise, or other malfunctions.

The present invention seeks to provide a heat transfer unit for a heat transfer member which permits efficient cooling of a semiconductor element. In general, the present invention proposes that the heat transfer unit of the heat transfer member has a plurality of layers laminated and bonded together, with each layer comprising a mesh of wires.

Wire mesh is relatively inexpensive to produce, and thus the heat transfer unit can be produced at a commercially acceptable cost. Furthermore, since the wires of the mesh will normally be formed by drawing, there is little or no machining dust, and thus there is less likelihood of malfunction of the semiconductor element.

It is possible for the heat transfer unit to be bonded directly to the semiconductor element. However, unless the material of the wires is chosen so that the linear expansion coefficient of the wires is similar to that of the semiconductor element, stress may develop at the point of bonding. For this reason, it is preferable that the heat transfer unit is mounted on a mounting sheet forming a composite heat transfer member, with the semiconductor element then bonded to the heat transfer member so that the mounting sheet is between the semiconductor element and the heat transfer unit. This permits the expansion coefficient of the mounting sheet to be chosen so that it, at least partially, reduces the strain of the bonding to the semiconductor element. This is achieved by selecting the material of the mounting sheet with an expansion coefficient between that of the semiconductor element and that of the heat transfer unit. For example, suppose that the wires are of copper or copper alloy (copper is a suitable material because it has a high thermal transfer coefficient), the mounting sheet may be e.g. a copper-molybdenum alloy.

There are a number of measures which may then be taken to improve the bonding between the various parts of the heat transfer member. First, if the wires are wholly of copper, there is a substantially point-like contact between them, and the amount of heat transferred may not be sufficiently great. To improve this, a silver coating may be provided on the wires. Then, the wire layers ca be bonded together by heating and compressing them, in a direction generally perpendicular to the plane of the wire mesh. This causes the silver to at least partially melt and form a good bond between the wires, and thus improving the efficiency of the heat transfer. Furthermore, it is difficult to satisfactorily to bond the wires to the mounting sheet. Therefore, a layer of gold may be formed on the mounting sheet to form a more satisfactory bond, particularly, if the wires are coated with silver. However, the bonding strength between gold and copper-molybdenum alloy is not great, so a nickel layer may then be provided between the gold layer and the copper-molybdenum alloy part of the mounting sheet.

Preferably, the wires of one layer of mesh are offset, in a direction parallel to the plane of the mesh layer, and relative to the immediate adjacent layer(s).

It is possible for the planes of the mesh layers to extend generally parallel to the surface of the semiconductor element on which the heat transfer member is mounted. However, there is then a substantially point-like contact of the wires with the semiconductor element or the mounting sheet, and therefore, it is preferable that the planes of the mesh layers are perpendicular to that surface of the semiconductor element, so that the ends of the wires contact the semiconductor element or the mounting sheet.

One important consideration is the relative volume of the wires of the mesh layers, as a proportion of the volume of the rest of the heat transfer unit (i.e. the spaces between the wires). Preferably, the volume of the wires is at least 30%, more preferably 40%, but is preferably not greater than 80%, more preferably 70%. Within these limits, the diameter of the wires and the spacing between the wires (which determines the mesh size) may be selected to suitable values.

In order to form the heat transfer member, the layers of wire mesh are placed adjacent each other, heated and compressed (the latter two operations normally being carried out simultaneously). Then, since it is efficient for the above operations to be carried out on relatively large pieces of mesh, it is desirable to cut the pieces to a size suitable to be mounted on the semiconductor element, and possibly to perform further cutting operations when the pieces of the layers have been mounted on the mounting sheet.

Even if this cutting operation is carried out by the known method of wire discharge machining, there is a risk of very fine dust particles being produced. Therefore, it is desirable that, after any cutting step, the dust particles are removed e.g. by the known method of ultrasonic washing. It is also noted that the amount of dust produced may also be reduced by an additional heating step, since some of the dust is then likely to bond to the wires, particularly if they are coated with silver. In any case, the amount of dust produced is much less than the amount that would be produced in cutting grooves in a solid metal sheet.

BRIEF DESCRIPTION OF THE DRAWINGS

Embodiments of the present invention will now be described in detail, by way of example, with reference to the accompanying drawings in which:

FIG. 3 shows steps in the production of a heat transfer member according to a second embodiment of the present invention;

FIG. 4 shows a heat transfer assembly having a heat transfer member formed according to the second embodiment of the present invention;

FIG. 5 shows a heat transfer assembly incorporating another embodiment of the present invention;

DETAILED DESCRIPTION

A first embodiment of the present invention will now be described with reference to FIG. 2. First, a plurality of metal meshes are formed by weaving together high purity (e.g. 99.99% purity) copper wire in a grid to form a plurality of wire mesh layers 10.

The number of mesh openings, the number of layers 10, and the diameter of the wires are selected to give a satisfactory volume of copper, as will be described later. For example, the number of mesh openings may be sixteen per square inch, and suitable wire diameters are 0.3 mm, 0.5 mm, and 0.8 mm.

After the wire meshes have been formed, their surfaces are plated with silver to a thickness of 2-3 $\mu$m. At this stage, the wire mesh layers 10 may be cut to a suitable size, e.g. 70×70 mm.

Figure 2:
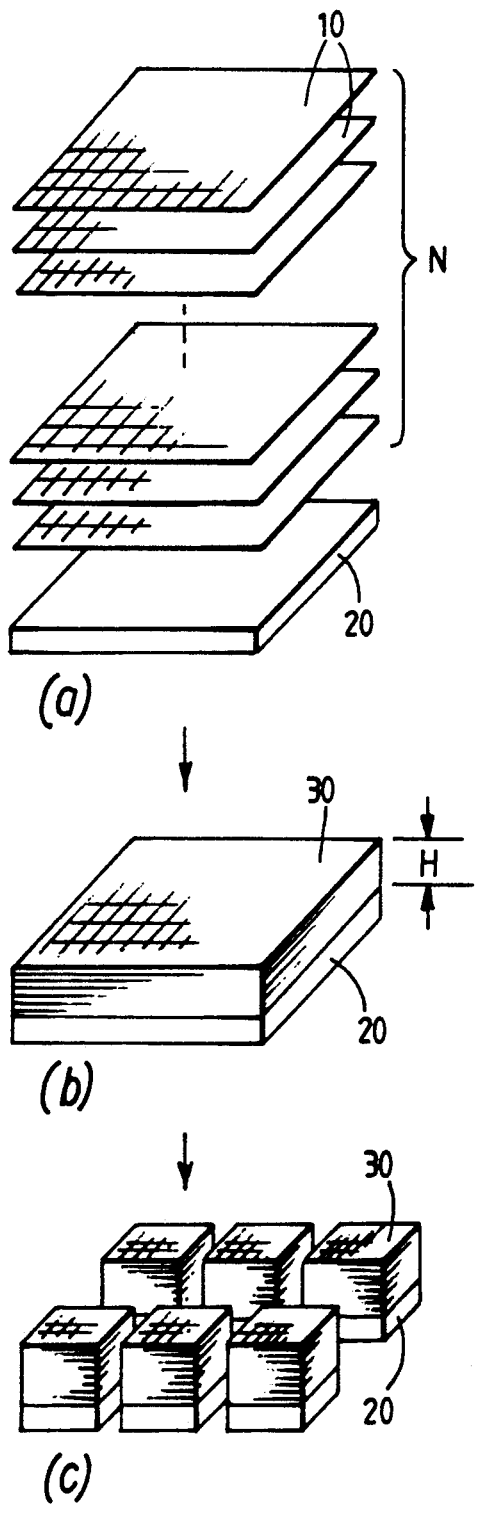
FIG. 2 shows steps in the production of a heat transfer member according to a first embodiment of the present invention.

Then, as shown at step (a) in FIG. 2, the layers 10 are located adjacent each other, and adjacent to a mounting sheet 20 of e.g. copper-molybdenum alloy. The mounting sheet 20 may have a composition consisting of 80 wt. % of molybdenum and 20 wt. % of copper. The mounting sheet 20 has, at least on its surface adjacent the wire mesh layers 10, a plating of nickel and gold. The plating of nickel being 2-3 $\mu$m thick and the plating of gold being 0.5 to 0.6 $\mu$m thick, and being outermost. The total thickness of the mounting sheet 20 is preferably about 1 mm, as this permits satisfactory reduction of the strain between the heat transfer unit 30 and the semiconductor element, as will be described later.

Then, the layers 10 and the mounting sheet 20 are pressed together, while being heated in a vacuum. The vacuum may be e.g. $1 \times 10^{-5}$ Torr, the temperature about 900° C., the pressure about 3 Nm$^{-2}$, and the duration of this operation about 1 hour.

During this heating and compression step, the silver of the plating film and the copper of the wire mesh layers 10 undergo a reaction and are bonded together at the points of contact of the copper wires of the mesh layers. Furthermore, the gold of the plating film on the mounting sheet 20 undergoes a reaction at the junction between the wires of the mesh layers 10 and the mounting sheet 20, so again satisfactory bonding is achieved. Thus, as shown at a step (b) in FIG. 2, a heat transfer member is produced, having a mounting sheet 20 and a heat transfer unit 30 comprising the wire mesh layers 10 laminated and bonded together. As was stated above, the number of layers 10 depends on the desired density of the wires, but it is generally preferred that the heat transfer unit 30 has a height H of approximately 10 mm. Then about 24 layers are needed if the wires have a diameter of 0.3 mm, 14 layers are needed if the diameter is to be 0.5 mm, and 9 layers are needed when the diameter of the wires is to be 0.8 mm. The amount of compression applied is also affected by the desired volume of copper, but a suitable ratio of the final thickness H of the heat transfer unit 30, as against the original total thickness of the layers 10, may be about 70% (i.e. a compression ratio C=0.7).

Finally, as shown at a step (c) in FIG. 2, the heat transfer member thus formed may be cut into a plurality of smaller heat transfer members. The size of which matches the size of the semiconductor elements to which the heat transfer members are to be attached.

A wire electric discharge machining may be used to perform the cutting operation, and although this is an efficient method, some machining dust may be produced. Therefore, the heat transfer members formed at the step shown at the step (c) in FIG. 2 may be cleaned by ultrasonic washing. In this process, the members are soaked in a suitable liquid, such as acetone, and ultrasonic vibrations are applied. Furthermore, the resulting heat transfer members may be heated to bond the dust to the wires of the heat transfer unit 30. For example, the heat transfer members may be heated at about 900° C. for one hour in a vacuum (at a pressure of e.g. $1 \times 10^{-5}$ Torr). In this way, any machining dust which has not been removed by the ultrasonic washing step is caused to adhere to the wires and is unlikely to be released and interfere with the semiconductor element.

Figure 1:
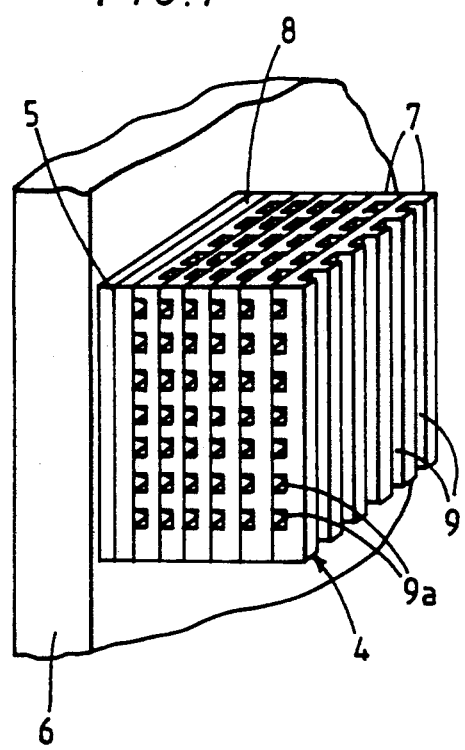
FIG. 1 shows a known heat transfer assembly that has already been described.

In the embodiment of FIG. 1, the planes of the wire mesh layers 10 extend generally parallel to the mounting sheet 20, as can be seen from the step (a) in FIG. 2. However, this means that there is substantially point-like contact between the lowest layer 10 and the mounting sheet 20, and this gives less satisfactory or reliable heat transfer. Therefore, in a second embodiment of the present invention, the layers 10 have a different orientation.

Referring to FIG. 3, again a plurality of layers 10 of wire mesh are positioned adjacent each other, as shown at a step (a) in FIG. 3. These layers 10 may be exactly the same as those used in the first embodiment. Then, the layers 10 are laminated and bonded together to form a heat transfer unit 30, as shown at a step (b) in FIG. 3. This laminating and bonding step is carried out by heating and compressing the layers 10, and again the conditions may be the same as in the first embodiment. However, it can be seen that, at this stage, the mounting sheet 20 is not present.

Subsequently, as shown at a step (c) in FIG. 3, the heat transfer unit 30 is cut into a plurality of pieces, having cut surfaces 80 extending generally perpendicular to the planes of the layers 10. The cut pieces of the heat transfer unit 30 are then mounted on a mounting sheet 20, as shown in FIG. 3(d) with the cut surfaces 80 adjacent and abutting the mounting sheet 20. The mounting sheet 20 may again be the same as that proposed for use in the first embodiment. Subsequently, a heating and compression step is applied, the conditions of which may be the same as before, for bonding the cut pieces of the heat transfer unit 30 to the mounting sheet 20, as shown at a step (e) in FIG. 3. During this heating and compression process, the silver film on the wires, and the gold film on the mounting sheet 20 undergo a reaction and are bonded together. Subsequently, the heat transfer unit 30 and the mounting sheet 20 are cut to conform to the size of the semiconductor element on which they are to be mounted.

As before, the cutting step may produce fine dust particles, and therefore a cleaning step, using e.g. the ultrasonic washing process described earlier, may be carried out after either or both of the cutting steps shown at the cutting steps (c) and (f) in FIG. 3. Furthermore, a heating step may also be carried out after the washing of the cut components shown at the step (f) in FIG. 3. A heating step after the cutting shown at the step (c) in FIG. 3 is generally not necessary because heating will occur during the heating and compression step when the cut pieces of the heat transfer unit 30 are bonded to the mounting sheet 20.

Subsequently, as shown in FIG. 4, the mounting sheet 20 is bonded to a semiconductor element 50 and the semiconductor element 50 is mounted on a base 60. FIG. 4 also shows a solder layer 70 between the mounting sheet 20 and the semiconductor element 50. The nickel-gold layer 90 is disposed between the heat transfer unit 30 and the mounting sheet 20. In the arrangement shown in FIG. 4, the planes of the wire mesh layers 10 extend generally perpendicularly to the plane of the mounting sheet 20 and the semiconductor element 50, i.e. the heat transfer unit 30 was produced by the method of the second embodiment shown in FIG. 3. The heat transfer unit 30 could also be produced by the method shown in FIG. 2.

During use of the semiconductor element 50, the semiconductor element 50 with attached base 60 and heat transfer member comprising mounting sheet 20 and heat transfer unit 30 is immersed in a liquid. Normally, the liquid is a non-conducting liquid such as a fluorocarbon liquid or another liquid known for use in immersion cooling.

It should be noted that FIG. 4 shows an arrangement in which the mounting sheet 20, and the semiconductor element 50, are generally vertical. This arrangement is important because it is found that a higher rate of heat transfer is achieved than if the mounting sheet 20 and the semiconductor element 50 are horizontal. It is believed that this is because there is a pump operation resulting from upward movement of vapour bubbles, and this prevents the formation of a film of vapour which could reduce heat transfer.

In the embodiments discussed above, the heat transfer unit 30 is attached to the semiconductor element 50 via the mounting sheet 20. The reason for this is that the expansion coefficient of the copper wires forming the layers 10 is much greater than that of the semiconductor element 50, particularly if the semiconductor element 50 is of silicon, and direct bonding would result in unacceptable stresses at the bonding interface. Therefore, the material of the mounting sheet 20 is chosen to have an expansion coefficient between that of the copper wires of the mesh layers 10 and the semiconductor element 50. However, if the mesh layers 10 are formed of wires which have an expansion coefficient similar, or close to, the expansion coefficient of the semiconductor element 50, then more direct bonding can be used. An embodiment in which this occurs is shown in FIG. 5, with the heat transfer unit 30 formed e.g. by the steps shown in FIG. 3, but without the mounting sheet 20.

In the heat transfer unit 30 of any of the above embodiments, the relative volume of the copper wires in the total volume of the heat transfer unit 30 is about 22% when the wire diameter $D=0.3$ mm, about 36% when the diameter $D=0.5$ mm and about 59% when $D=0.8$ mm. The spaces between the wires in the heat transfer unit 30 in these examples are then about $0.3 \sim 1.3 \times 0.3 \sim 1.3$ mm with a diameter $D=0.3$ mm, about $0.3 \sim 1.1 \times 0.3 \sim 1.1$ mm with a diameter $D=0.5$ mm and about $0.3 \sim 0.8 \times 0.3$ 0.8 mm with a diameter $D=0.8$ mm. The spaces are connected to one another in the longitudinal, transverse and vertical directions. Furthermore, the relative volume of copper and the shapes of the spaces may be generally the same in both the embodiments discussed with reference to FIGS. 2 and 3.

The heat transfer member for immersion cooling of a semiconductor element which is formed by laminating and bonding metal wire mesh layers as described above makes it possible to easily control the relative volume of metal in the heat transfer unit 30, the volume ratio of the spaces and the size of the spaces by choice of e.g. the diameter of the wires forming the metal wire mesh, and/or the number of mesh openings.

The change of the relative volume of copper when the wire diameter of the copper wire and the mesh number are changed in the embodiments described above will now be explained with reference to FIGS. 6 and 7.

Figure 6:
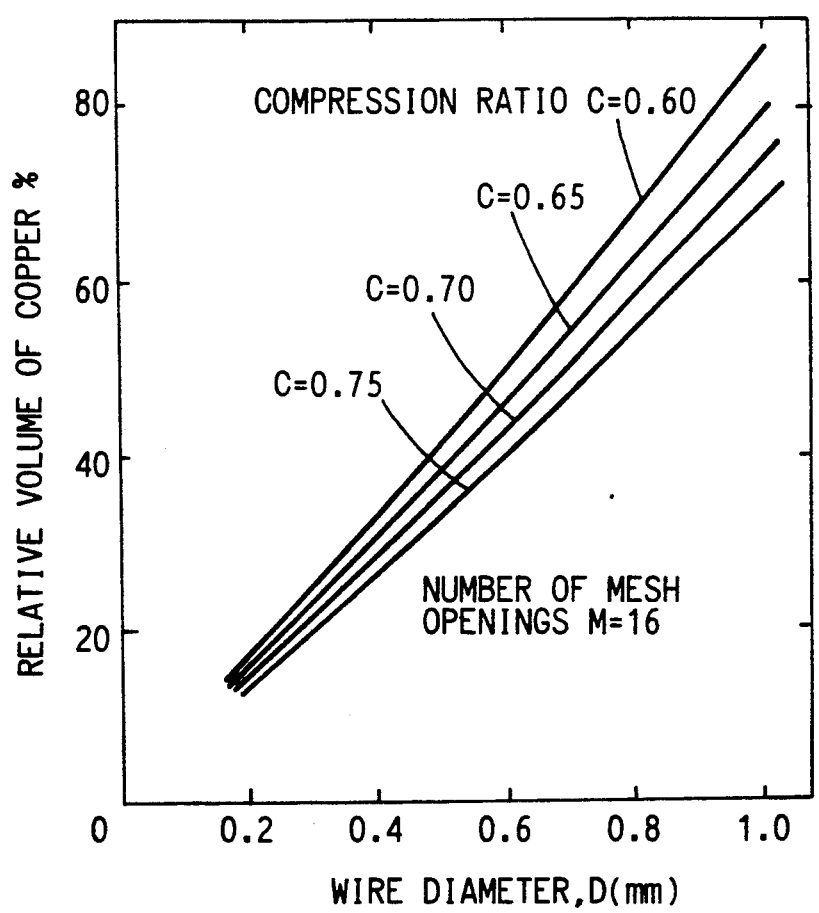
FIG. 6 shows the variation in relative volume of copper wire with wire diameter, for different compression ratios.
Figure 7:
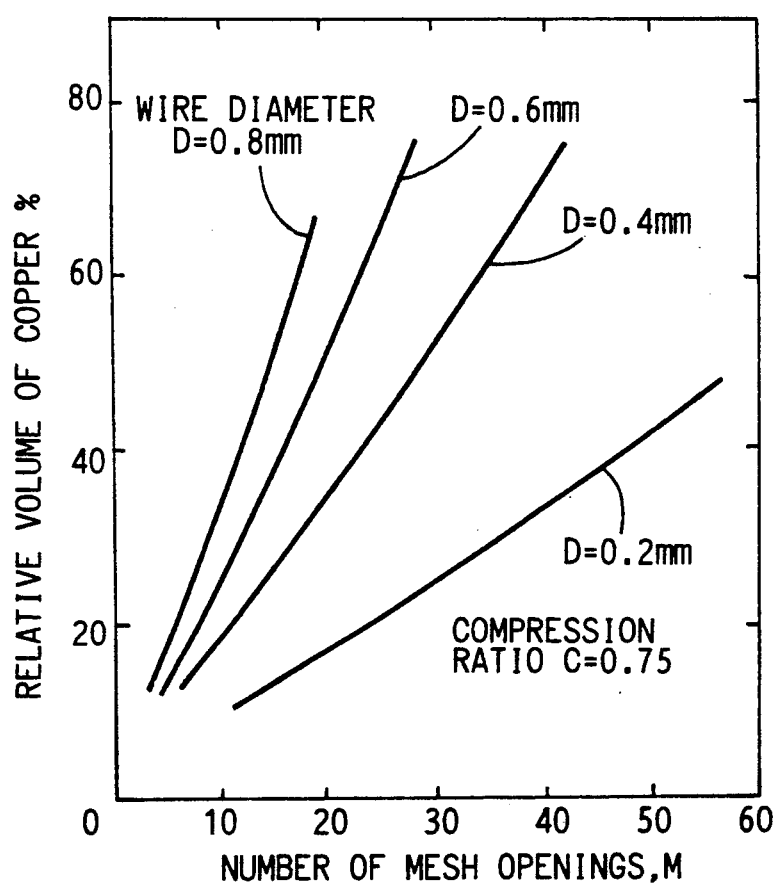
FIG. 7 shows the variation in relative volume of copper with a number of mesh openings, for different wire diameters.

FIG. 6 shows the change of the relative volume of copper with the ratio of the height of the layers of copper wire mesh before and after lamination and bonding, that is, the compression ratio C, with the number of mesh openings M per square inch being kept constant at 16 per square inch (M=16). FIG. 7 shows the relative volume of copper when the number of mesh openings M per square inch and the wire diameter D is changed with the compression ratio C being kept constant at C=0.75. The relative volume of copper is preferably within the range 30 to 70 vol% in the heat transfer unit 30 in order to achieve a satisfactory cooling capacity. The wire diameter of the copper wire is preferably below 1.0 mm in order to achieve a satisfactory ratio of copper surface area to volume.

The present invention can produce a heat transfer member for immersion cooling at a low cost by laminating and bonding layers of copper wire mesh. Other wire materials, such as silver, could be used to form the layers 10 but the cost is then increased. The ratio of the copper to the spaces therebetween, the size of the spaces in the heat transfer unit, etc. can be controlled readily by selecting the mesh grade and wire diameter of the copper wire mesh. The generation of dust can be reduced because machining of the copper wire mesh such as cutting is less and because heating steps may adhere the dust to the mesh.

Since the coefficient of linear expansion of the copper-molybdenum alloy mounting sheet 20 is between those of silicon and copper, stress occurring due to the thermal cycle at the time of assembly and operating resulting from the difference of the coefficients of linear expansion of copper and silicon can be reduced. Since the copper wires forming the copper mesh may be bonded with the planes of the layers 10 at right angles to the copper-molybdenum alloy mounting sheet 20, the bonding area between the copper meshes and the copper-molybdenum alloy mounting sheet 20 increases, the heat transfer coefficient also increases, and the cooling capacity as the heat transfer member for immersion cooling can be improved.

Thus, according to the present invention, the heat transfer member for immersion cooling is produced by heat transfer units 30 formed by laminating together metal wire mesh layers 10. Accordingly, the ratio of the spaces to the copper, the size of the voids, and the like, can be controlled easily and the occurrence of machining dust can be reduced.

Since the heat transfer unit 30 is laminated on the copper-molybdenum alloy mounting sheet 20, the stress with silicon can be relieved and since the metal wires may be bonded substantially at right angles, the heat transfer coefficient increases and the cooling capacity can be increased.

What is claimed is:

1. A heat transfer assembly comprising:
 a semiconductor element; and
 a heat transfer member mounted on said semiconductor element for enabling immersion cooling thereof, said heat transfer member including a heat transfer unit having a plurality of layers laminated and bonded together, each layer of said plurality of layers comprising a mesh of wires.

2. An assembly according to claim 1, wherein said heat transfer member further includes a mounting sheet disposed between said heat transfer unit and said semiconductor element.

3. An assembly according to claim 2, wherein said mounting sheet has a linear expansion coefficient which is between that of said heat transfer unit and that of said semiconductor element.

4. An assembly according to claim 2, wherein said heat transfer assembly further includes a solder bonding between said mounting sheet of said heat transfer member and said semiconductor element.

5. An assembly according to claim 1, wherein said layers define generally parallel planes, and said wires of one layer of said plurality of layers are offset relative to said wires of an immediately adjacent layer of said plurality of layers in a direction parallel to said planes of said layers.

6. An assembly according to claim 1, wherein said plurality of layers define generally parallel planes, and said planes extend generally parallel to an interface between said heat transfer element and said semiconductor element.

7. An assembly according to claim 1, wherein said wires of each layer of said plurality of layers are of a material selected from a group consisting of copper and copper alloy.

8. An assembly according to claim 1, wherein a volume of said wires in said heat transfer unit is at least 30%.

9. An assembly according to claim 8, wherein said volume of said wires in said heat transfer unit is between 40% and 80%.

10. A heat transfer member mounted on a semiconductor element comprising:
 a heat transfer unit having a plurality of layers laminated and bonded together, each layer of said plurality of layers comprising a mesh of wires, said heat transfer unit being fixed to a semiconductor element for enabling immersion cooling thereof; and
 a mounting sheet bonded to a surface of said heat transfer unit.

11. A heat transfer member according to claim 10, wherein said mounting sheet has a linear expansion coefficient which is less than that of said heat transfer unit.

12. A heat transfer assembly comprising:
 a semiconductor element;
 a heat transfer member mounted on said semiconductor element for enabling immersion cooling thereof, said heat transfer member including a heat transfer unit having a plurality of layers laminated and bonded together, each layer of said plurality of layers comprising a mesh of wires; and a mounting sheet made principally of copper-molybdenum alloy is disposed between said heat transfer unit and said semiconductor element.

13. A heat transfer assembly comprising:

a semiconductor element;

a heat transfer member mounted on said semiconductor element for enabling immersion cooling thereof, said heat transfer member including a heat transfer unit having a plurality of layers laminated and bonded together, each layer of said plurality of layers comprising a mesh of wires; and a mounting sheet is disposed between said heat transfer unit and said semiconductor element and including a layer of gold adjacent to said heat transfer unit.

14. A heat transfer assembly comprising:

a semiconductor element; and a heat transfer member mounted on said semiconductor element for enabling immersion cooling thereof, said heat transfer member including a heat transfer unit having a plurality of layers laminated and bonded together, each layer of said plurality of layers comprising a mesh of wires; and a mounting sheet is disposed between said heat transfer unit and said semiconductor element and including a layer of gold adjacent to said heat transfer unit, wherein aid mounting sheet further having a nickel layer disposed between said layer of gold and other parts of said mounting sheet.

15. A heat transfer assembly comprising:

a semiconductor element; and a heat transfer member mounted on said semiconductor element for enabling immersion cooling thereof, said heat transfer member including a heat transfer unit having a plurality of layers laminated and bonded together, each layer of said plurality of layers comprising a mesh of wires, wherein said plurality of layers defining generally parallel planes, and said planes extending generally perpendicular to an interface between said heat transfer unit and said semiconductor element.

16. A heat transfer assembly comprising:

a semiconductor element; and a heat transfer member mounted on said semiconductor element for enabling immersion cooling thereof, said heat transfer member including a heat transfer unit having a plurality of layers laminated and bonded together, each layer of said plurality of layers comprising a mesh of wires, wherein said wires of each layer of said plurality of layers are of a material selected from a group consisting of copper and copper alloy and said wires further having a silver coating thereon.

17. A heat transfer member mounted on a semiconductor element consisting of:

a heat transfer unit having a plurality of layers laminated and bonded together, each layer of said plurality of layers consisting of a mesh of wires, said heat transfer unit being fixed to a semiconductor element for enabling immersion cooling thereof; and a mounting sheet bonded to a surface of said heat transfer unit.

* * * * *